United States Patent
Lee et al.

(10) Patent No.: US 9,524,782 B2
(45) Date of Patent: Dec. 20, 2016

(54) NONVOLATILE MEMORY DEVICE AND METHOD OF WRITING DATA IN NONVOLATILE MEMORY DEVICE

(71) Applicant: SAMSUNG ELECTRONICS CO., LTD., Suwon-Si, Gyeonggi-Do (KR)

(72) Inventors: Ji-Sang Lee, Jeollabuk-Do (KR); Ki-Hwan Choi, Seongnam-Si (KR); Oh-Suk Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 91 days.

(21) Appl. No.: 14/554,128

(22) Filed: Nov. 26, 2014

(65) Prior Publication Data

US 2015/0155046 A1    Jun. 4, 2015

(30) Foreign Application Priority Data

Dec. 3, 2013    (KR) .................. 10-2013-0149494

(51) Int. Cl.
| | |
|---|---|
| G11C 16/34 | (2006.01) |
| G11C 16/10 | (2006.01) |
| G11C 11/56 | (2006.01) |
| G11C 16/08 | (2006.01) |

(52) U.S. Cl.
CPC ........... *G11C 16/10* (2013.01); *G11C 11/5628* (2013.01); *G11C 16/08* (2013.01); *G11C 16/3459* (2013.01)

(58) Field of Classification Search
CPC ..................................... G11C 16/34
USPC ..................................... 365/185.18
See application file for complete search history.

(56) References Cited

U.S. PATENT DOCUMENTS

| | | | | |
|---|---|---|---|---|
| 5,936,890 A | * | 8/1999 | Yeom ..................... | G11C 16/10 365/185.12 |
| 6,538,923 B1 | * | 3/2003 | Parker ................. | G11C 11/5628 365/185.03 |
| 2001/0046167 A1 | * | 11/2001 | Ayukawa ................ | G11C 5/04 365/200 |
| 2003/0174555 A1 | * | 9/2003 | Conley ............... | G11C 11/5628 365/200 |
| 2005/0251643 A1 | | 11/2005 | Dirscherl et al. | |
| 2007/0109858 A1 | | 5/2007 | Conley et al. | |
| 2009/0034338 A1 | * | 2/2009 | Lin ......................... | G11C 16/30 365/185.21 |
| 2009/0059658 A1 | * | 3/2009 | Cho ..................... | G11C 7/1078 365/163 |
| 2009/0094482 A1 | | 4/2009 | Zilberman | |
| 2010/0125701 A1 | * | 5/2010 | Park ..................... | G06F 11/141 711/103 |

(Continued)

FOREIGN PATENT DOCUMENTS

JP          10-125082        5/1998

*Primary Examiner* — Min Huang
(74) *Attorney, Agent, or Firm* — Volentine & Whitt, PLLC

(57) ABSTRACT

A nonvolatile memory device, including a first latch unit and a nonvolatile memory cell, and a method of writing data in a nonvolatile memory device are provided. The method includes receiving a first writing command or a second writing command from outside of the nonvolatile memory device, and writing first data stored in the first latch unit in the nonvolatile memory cell in response to the first or second writing command. The first data is retained in the first latch unit until the writing of the first data stored in the first latch unit in the nonvolatile memory cell is completed.

18 Claims, 15 Drawing Sheets

(56) References Cited

U.S. PATENT DOCUMENTS

2010/0232230 A1* 9/2010 Ueno ................. G11C 16/3436
365/185.22
2013/0322171 A1* 12/2013 Lee ........................ G11C 29/04
365/185.03

* cited by examiner

FIG. 3
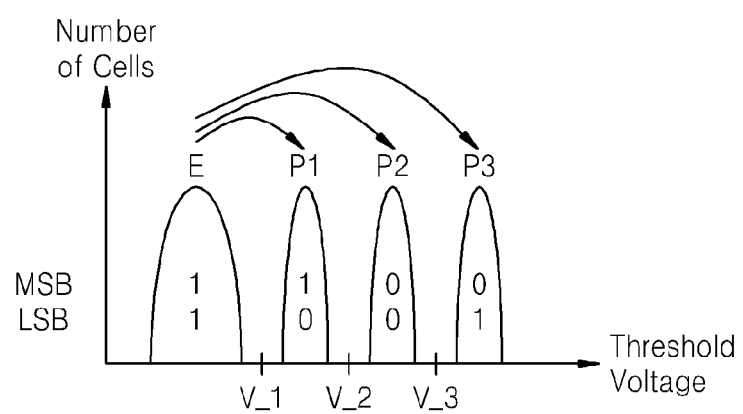
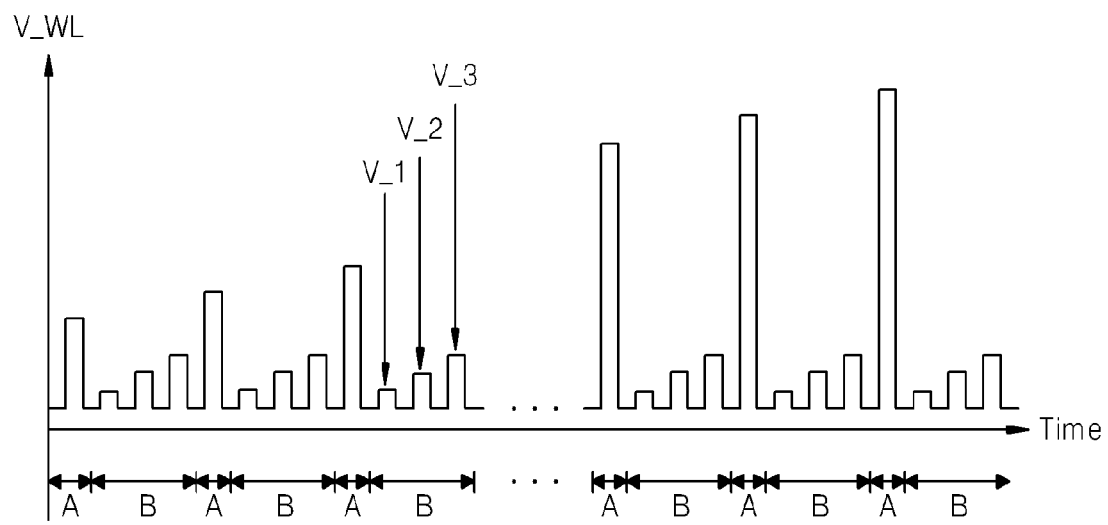

NONVOLATILE MEMORY DEVICE AND METHOD OF WRITING DATA IN NONVOLATILE MEMORY DEVICE

CROSS-REFERENCE TO RELATED APPLICATION

A claim for priority under 35 U.S.C. §119 is made to Korean Patent Application No. 10-2013-0149494, filed on Dec. 3, 2013, in the Korean Intellectual Property Office, the entire contents of which are hereby incorporated by reference.

BACKGROUND

Embodiments of the inventive concept relate to a nonvolatile memory device and a method of writing data in a nonvolatile memory system including the nonvolatile memory device, and more particularly, to a nonvolatile memory device including a nonvolatile memory cell and a method of writing data in a nonvolatile memory system including the nonvolatile memory device.

A nonvolatile memory device is able to retain stored data even when no power is provided by a power supply. Flash memory, which is an example of a nonvolatile memory device, may include a nonvolatile memory cell that is capable of electrically writing or erasing data, and the nonvolatile memory cell may include a floating-gate transistor. The nonvolatile memory cell may store data by controlling a threshold voltage of the floating-gate transistor.

The amount of data that may be stored in the nonvolatile memory cell may be increased by precisely controlling the threshold voltage of the floating-gate transistor. For example, when the threshold voltage of the floating-gate transistor is controlled to have two different values, one nonvolatile memory cell may store one bit. However, when the threshold voltage of the floating-gate transistor is controlled to have four different values, the one nonvolatile memory cell may store two bits.

SUMMARY

The inventive concept provides a nonvolatile memory device and a method of writing data in a nonvolatile memory system including the nonvolatile memory device. According to the method of writing data of the nonvolatile memory system, a nonvolatile memory cell is programmed based on data to write.

According to an aspect of the inventive concept, there is provided a method of writing data in a nonvolatile memory device including a first latch unit and a nonvolatile memory cell. The method includes receiving a first writing command or a second writing command from outside of the nonvolatile memory device; and writing first data stored in the first latch unit in the nonvolatile memory cell in response to the first or second writing command. The first data is retained in the first latch unit until the writing of the first data stored in the first latch unit in the nonvolatile memory cell is completed.

The nonvolatile memory device may further include a second latch unit that stores second data. The writing of the first data may include selectively programming the nonvolatile memory cell according to the second data; verifying the nonvolatile memory cell based on the first data; and changing the second data according to a verification result. The writing of the first data may be repeated one or more times by incremental step pulse programming (ISPP).

The method may further include setting the second data according to the first data in response to the first or second writing command prior to the writing of the first data stored in the first latch unit in the nonvolatile memory cell.

The receiving of the first or second writing command may include retaining the first data stored in the first latch unit upon receiving the first writing command, and changing the first data stored in the first latch unit to data received, in response to the second writing command, from outside of the nonvolatile memory device, upon receiving the second writing command.

The nonvolatile memory cell may stores a plurality of bits, and the first latch unit may include a plurality of latches equal in number to the plurality of bits.

The nonvolatile memory device may further include a plurality of the nonvolatile memory cells; and a plurality of the first latch units each corresponding to a nonvolatile memory cell connected to a word line among the plurality of the nonvolatile memory cells.

The method may further include receiving data from outside of the nonvolatile memory device; encoding the received data according to an error correction code (ECC); and storing the encoded data in the first latch unit as the first data.

The method may further include providing a state machine for controlling the writing of data in the nonvolatile memory device.

According to another aspect of the inventive concept, there is provided a method of writing data in a nonvolatile memory system including a nonvolatile memory device and a memory controller communicating with the nonvolatile memory device, where the nonvolatile memory device includes a first latch unit and a nonvolatile memory cell in a cell array. The method includes receiving a first or second writing command from the memory controller, and writing first data stored in the first latch unit in the nonvolatile memory cell, in response to the first or second writing command. The first data is retained in the first latch unit until the writing of the first data in the nonvolatile memory cell is completed.

The receiving of the first or second writing command may include retaining the first data stored in the first latch unit upon receiving the first writing command, and changing the first data stored in the first latch unit to data received, in response to the second writing command, from outside of the nonvolatile memory device upon receiving the second writing command.

The method may further include transmitting the first writing command to the nonvolatile memory device via the memory controller when the writing of the first data fails.

The method may further include storing data to be written in the nonvolatile memory device in a buffer region of a buffer in the memory controller, transmitting the second writing command and the data stored in the buffer region to the nonvolatile memory device via the memory controller, and setting the buffer region to an available state after transmitting the second writing command to the nonvolatile memory device.

The nonvolatile memory device may further include a second latch unit that stores second data. The writing of the first data may then include selectively programming the nonvolatile memory cell according to the second data, verifying the nonvolatile memory cell based on the first data, and changing the second data according to a verification result.

The nonvolatile memory system may be a multimedia card (MMC), a secure digital (SD) card, or a solid state drive (SSD).

The first latch unit may include a data latch unit for storing the first data, and the second latch unit may include an inhibit latch unit for storing the second data indicating whether the nonvolatile memory cell is program-inhibited.

According to another aspect of the inventive concept, there is provided a nonvolatile memory device including a cell array, a control unit and a page buffer. The cell array includes a plurality of nonvolatile memory cells in a page cell group corresponding to a word line, each nonvolatile memory cell being accessible by the word line and a bit line, and capable of transitioning between a plurality of states corresponding to respective data. The control unit is configured to receive a first writing command and a second writing command. The page buffer includes a logic unit connected to the control unit and the cell array to enable control of the page buffer and the cell array; a data latch set including at least a first data latch storing first data for writing in a nonvolatile memory cell of the plurality of nonvolatile memory cells in response to the first or second writing command under control of the control unit; and an inhibit latch set including an latch for storing data indicating whether a corresponding nonvolatile memory cell is in a program inhibited state. The first data is retained in the first latch unit until writing the first data in the nonvolatile memory cell is completed.

When data to be stored in a nonvolatile memory cell corresponds to an erased state, the corresponding inhibit latch may indicate that the nonvolatile memory cell is program-inhibited.

The page buffer may further included a sensing latch set configured to store data to be written to or read from the cell array, such that the logic unit applies voltage to a bit line according to the data stored in the sensing latch or sets the data stored in the sensing latch set according to the voltage of the bit line.

The nonvolatile memory device may further include an error correction code (ECC) engine configured to encode data received from outside of the non-volatile memory device and transmit the encoded data to the data latch set, and to decode encoded data received from the data latch set and output the decoded data to the outside of the nonvolatile memory device.

BRIEF DESCRIPTION OF THE DRAWINGS

Exemplary embodiments of the inventive concept will be more clearly understood from the following detailed description taken in conjunction with the accompanying drawings, in which:

FIG. 3 is a view illustrating an operation of programming a nonvolatile memory cell, according to an exemplary embodiment of the inventive concept;

DETAILED DESCRIPTION OF THE EMBODIMENTS

Figure 1:
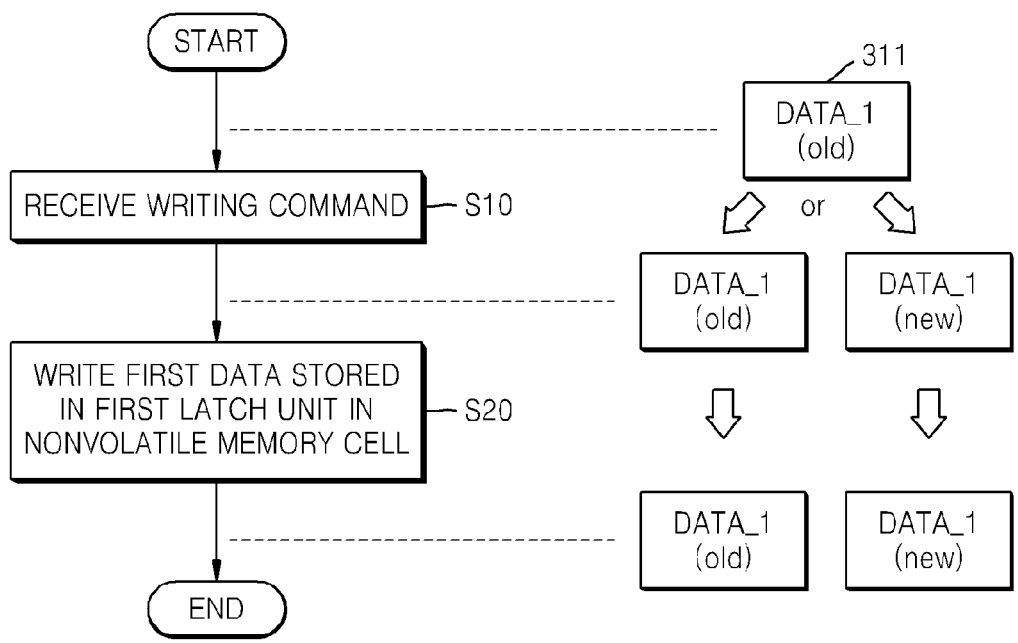
FIG. 1 is a flowchart and a functional block diagram illustrating a method of writing data in a nonvolatile memory device, according to an exemplary embodiment of the inventive concept.

Embodiments will be described in detail with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Accordingly, known processes, elements, and techniques are not described with respect to some of the embodiments. Unless otherwise noted, like reference numerals denote like elements throughout the attached drawings and written description, and thus descriptions may be repeated. In the drawings, sizes and relative sizes of layers and regions may be exaggerated for clarity.

The terminology used herein is for describing particular embodiments and is not intended to be limiting of exemplary embodiments. As used herein, the singular forms "a," "an," and "the," are intended to include the plural forms as well, unless the context clearly displays otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meanings as commonly understood in the art to which the exemplary embodiments belong. It will be further understood that the terms such as those defined in commonly used dictionaries should be interpreted as having meanings consistent with their meanings in the context of the relevant art and will not be interpreted in an idealized or overly formal sense unless expressly so defined herein.

In this specification, "write" is understood to mean "store data in a memory device or a memory system," and "program/programmed/programming" is understood to mean "change of a state in which a memory cell included in the memory device is erased to other states in order to write data." Also, "erase" is understood to mean "change of a state to the state in which the memory cell is erased." In other words, "writing" data in the memory device may be understood as selectively "programming" the memory cells included in the memory device, which are erased, according to data. The term "exemplary" is intended to refer to an example or illustration.

FIG. 1 is a flowchart and block diagram illustrating a method of writing data in a nonvolatile memory device, according to an exemplary embodiment of the inventive concept. Referring to FIG. 1, the nonvolatile memory device includes a first data latch unit 311 and a second data latch unit (not shown). The first data latch unit 311 is for storing first data DATA_1 in order to write the first data DATA_1 in a nonvolatile memory cell of the nonvolatile memory device. The first data latch unit 311 may be referred to as a data latch unit 311 in FIG. 2 described below. The second data latch unit is for storing second data DATA_2 including information about program inhibit of the nonvolatile memory cell. The second data latch unit may be referred to as an inhibit latch unit 321 in FIG. 2 described below. Hereinafter, the first data latch unit 311 and the data latch unit 311 are the same elements, and the second latch unit and the inhibit latch unit 321 are the same elements.

As shown in the flowchart of FIG. 1, the data writing method according to the exemplary embodiment may include receiving a writing command from outside the nonvolatile memory device (S10) (which may be referred to as an external writing command), and writing the first data DATA_1 stored in the first data latch unit 311 of the nonvolatile memory device in the nonvolatile memory cell (S20) in response to the writing command. Also, as shown in FIG. 1, the first data DATA_1 is stored in the first data latch unit 311 while the data writing method is being performed. As shown in FIG. 1, the first data latch unit 311 may store old first data DATA_1 (old) before receiving the writing command from outside of the nonvolatile memory device. The old first data DATA_1 (old) may be data corresponding to a writing command that the nonvolatile memory device previously received. According to a writing command that the nonvolatile memory device receives from outside, the first data latch unit 311 may retain the old first data DATA_1 (old) or store new first data DATA_1 (new). The new first data DATA_1 (new) may be data received from outside of the nonvolatile memory device corresponding to the received writing command.

While writing the first data DATA_1 stored in the first data latch unit 311 in the nonvolatile memory cell (S20) is being performed, the first data latch unit 311 may retain the stored data. For example, the first data latch unit 311 may store the first data DATA_1 written in the nonvolatile memory cell, that is, the old first data DATA_1 (old) or the new first data DATA_1 (new).

The same data may be repeatedly written in the nonvolatile memory device. For example, when data fails to be written in the nonvolatile memory device, writing of the data in the nonvolatile memory device may be performed again. Also, when the nonvolatile memory device is flash memory, the data may be written again to narrow a distribution range of a threshold voltage of a floating-gate transistor.

When the same data is repeatedly written in the nonvolatile memory device, the first data DATA_1 may be re-used since the first data latch unit 311 according to the present exemplary embodiment retains the first data DATA_1. Accordingly, the nonvolatile memory device does not need to receive the first data DATA_1 again from the outside.

Figure 2:
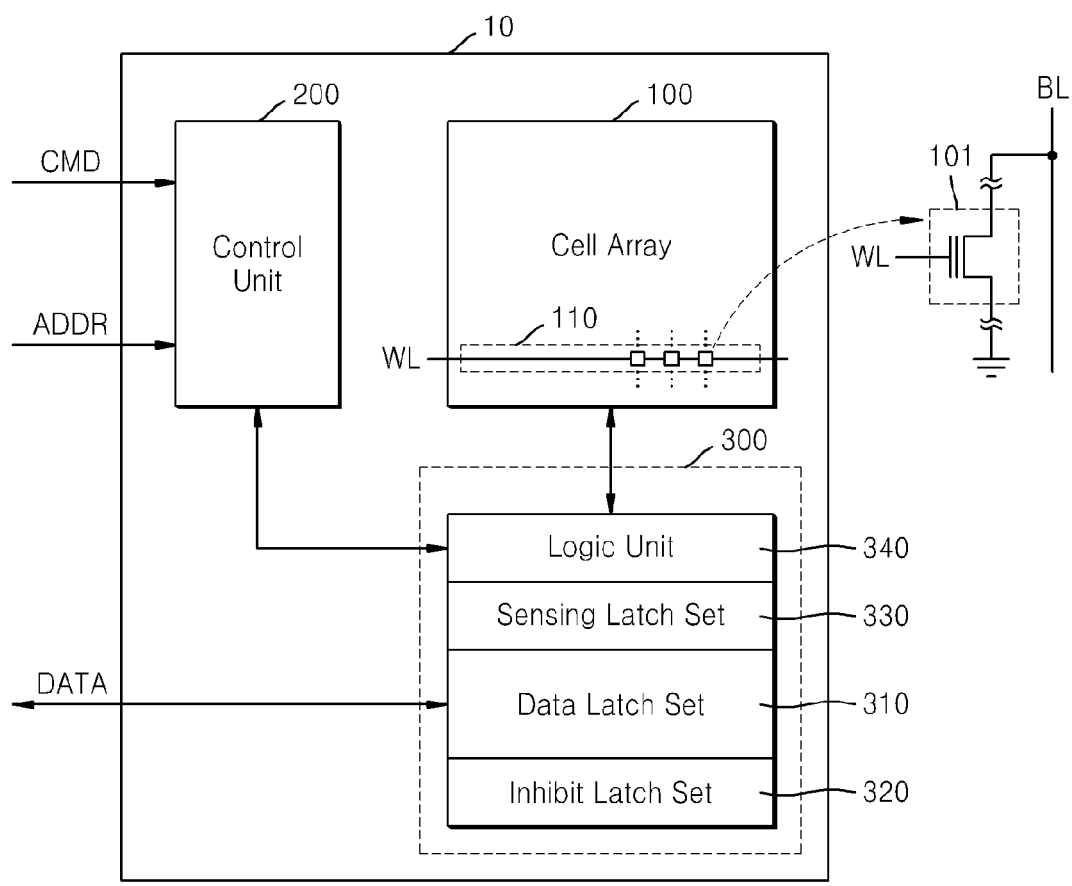
FIG. 2 is a block diagram illustrating a structure of a nonvolatile memory device, according to an exemplary embodiment of the inventive concept.

FIG. 2 is a block diagram of a structure of a nonvolatile memory device 10, according to an exemplary embodiment of the inventive concept. The nonvolatile memory device 10 receive a command CMD and an address ADDR from the outside, and receives and transmits data DATA. For example, when the command CMD that the nonvolatile memory device 10 receives from the outside is a reading command, the nonvolatile memory device 10 may output data DATA stored in a nonvolatile memory cell 101 corresponding to the received address ADDR.

As shown in FIG. 2, the nonvolatile memory device 10 includes a cell array 100, a control unit 200, a data latch set 310, an inhibit latch set 320, a sensing latch set 330, and a logic unit 340. In particular, the data latch set 310, the inhibit latch set 320, the sensing latch set 330, and the logic unit 340 form a page buffer 300.

The cell array 100 may include a plurality of nonvolatile memory cells 101. Each nonvolatile memory cell 101 may be accessed by a word line WL and a bit line BL. The nonvolatile memory cells 101 connected to the same word line WL are referred to as a page cell group (e.g., page cell group 110). The nonvolatile memory cell 101 is a memory unit capable of transitioning between a plurality of states, each of states corresponding to data. Also, the nonvolatile memory cell 101 may retain a previous state even when power supply stopped, and thus data may be retained. For example, the nonvolatile memory cell 101 may be flash memory cell, and accordingly, may include a floating-gate transistor as shown in FIG. 2. Hereinafter, the nonvolatile memory device 10 is assumed to be flash memory. However, other types of memories may be incorporated without departing from the scope of the present teachings.

Meanwhile, the number of states that the nonvolatile memory cell 101 is capable of transitioning between may be two or more. For example, when the nonvolatile memory cell 101 is capable of transitioning between is two states, the nonvolatile memory cell 101 may store one bit. When the nonvolatile memory cell 101 is capable of transitioning between is four states, the nonvolatile memory cell 101 may store two bits. In particular, as the nonvolatile memory cells 101 are flash memory cells, the nonvolatile memory cells 101 that may store one, two, three, and four bits are respectively referred to as a single level cell SLC, a multi level cell MLC, a triple level cell TLC, and a quadruple level cell QLC. Hereinafter, the nonvolatile memory cell 101 is assumed to be an MLC for purposes of illustration. However, embodiments of the present inventive concept are not limited thereto.

In the flash memory, a unit of data writing and a unit of data erasing may be different from each other. For example, data writing may be performed in page units while data erasing may be performed in block units, which are larger than page units. When the nonvolatile memory cell 101 is programmed, an electron may be injected into a floating gate. In contrast, when the nonvolatile memory cell 101 is erased, the previously injected electron may be extracted from the floating gate. A high voltage may be applied to a gate of the floating-gate transistor to inject an electron into the floating gate. Since gates of the nonvolatile memory cells 101 included in page cell group 110 are connected to the same word line WL, the high voltage may be commonly applied to the nonvolatile memory cells 101 of the word line WL during programming.

A voltage applied to a bit line BL may be controlled to selectively program the nonvolatile memory cells 101 included in the page cell group 110 according to data to be written. The nonvolatile memory cells 101 included in the page cell group 110 may be connected to different bit lines BL. For example, 0V or 1V may be applied to the bit line BL connected to the nonvolatile memory cell 101 that is to inject an electron to the floating gate, while a power voltage VDD may be applied to the bit line BL connected to the nonvolatile memory cell 101 that is to prevent the electron from being injected to the floating gate. The nonvolatile memory cell 101 connected to the bit line BL to which a voltage of 0V or 1V is applied is referred to as being programmed, and the nonvolatile memory cell 101 connected to the bit line BL to which the power voltage VDD is applied is referred to as being program-inhibited.

The logic unit 340 is connected to the control unit 200 and the bit line BL. The control unit 200 may set data in a latch included in the sensing latch set 330 or read the data stored in the latch via the logic unit 340. The logic unit 340 may apply a voltage to the bit line BL according to the data stored in the latch of the sensing latch set 330 or set the data stored in the latch of the sensing latch set 330 according to the voltage of the bit line BL. The data latch set 310 stores data to write in the page cell group 110. The data latch set 310 includes a plurality of latches. Data stored by the plurality of latches store may be data DATA received from outside of the nonvolatile memory device 10. The control unit 200 controls the logic unit 340 so that the data DATA is stored in the data latch set 310.

The inhibit latch set 320 stores data indicating whether the nonvolatile memory cells 101 included in the page cell group 110 are programmed or not. For example, when data to be stored in a nonvolatile memory cell 101 corresponds to an erased state E of the nonvolatile memory cell 101, the nonvolatile memory cell 101 may be program-inhibited and a latch included in the inhibit latch set 320 and corresponding to the nonvolatile memory cell 101 may store data indicating this information. Also, in an incremental step pulse programming (ISPP) technique, data stored in the inhibit latch set 320 may indicate whether or not the nonvolatile memory cell 101 is program-inhibited in a following programming process.

The control unit 200 controls the data latch set 310, the inhibit latch set 320, and the sensing latch set 330 via the logic unit 340. Also, the control unit 200 receives a command CMD and an address ADDR from outside of the nonvolatile memory device 10. Based on this, the control unit 200 enables the nonvolatile memory device 10 to perform the method of writing data according to an exemplary embodiment. For example, the control unit 200 may be a logic circuit that provides a state machine. FIG. 2 illustrates only a portion of components that may be included in the nonvolatile memory device 10 according to the present exemplary embodiment. For example, the control unit 200 may control not only the components included in the nonvolatile memory device 10 as illustrated in FIG. 2, but also other components, such as a row decoder that provides a word line WL.

The command CMD received by the control unit 200 may include a first writing command CMD_1 or a second writing command CMD_2 requesting storage of data in the cell array 100. The control unit 200 may change or retain data stored in the data latch set 310 in response to the first writing command CMD_1 or the second writing command CMD_2. The control unit 200 may write the data changed or retained in the nonvolatile memory cells 101 included in the cell array 100.

For example, the control unit 200 may receive an address ADDR corresponding to the first writing command CMD_1. The control unit 200 controls the logic unit 340, the data latch set 310, and the inhibit latch set 320 so that the data stored in the data latch set 310 is stored in the nonvolatile memory cell 101 corresponding to the address ADDR, in response to the first writing command CMD_1. Meanwhile, the control unit 200 may receive an address ADDR and data DATA corresponding to the second writing command CMD_2. The control unit 200 may store the received data DATA in the data latch set 310 in response to the second writing command CMD_2. The control unit 200 controls the logic unit 340, the data latch set 310, and the inhibit latch set 320 so that the data stored in the data latch set 310 is stored in the nonvolatile memory cell 101 corresponding to the address ADDR.

According to the present exemplary embodiment, the control unit 200 enables the data latch set 310 to retain the data even after writing the data in the nonvolatile memory cells 101 in response to the first writing command CMD_1 or the second writing command CMD_2 is completed. That is, when the control unit 200 receives the first writing command CMD_1 and completes writing the data in the nonvolatile memory, the data retained in the data latch set 310 may correspond to a writing command (the first or second writing command CMD_1 or CMD_2 or other writing commands) received prior to the first writing command CMD_1. Meanwhile, when the control unit 200 receives the second writing command CMD_2 and completes writing the data in the nonvolatile memory, the data retained in the data latch set 310 may be data DATA received with the second writing command CMD_2.

FIG. 3 is a view illustrating an operation of programming the nonvolatile memory cell 101, according to an exemplary embodiment of the inventive concept. As described above, the nonvolatile memory cell 101 may store data (one or more bits) by controlling threshold voltage distribution of the floating-gate transistor. FIG. 3 illustrates the operation of programming the nonvolatile memory cell 101 that stores two bits, that is, an MLC. The nonvolatile memory cell 101 is capable of transition between four states E, P1, P2, and P3 to store two bits. As illustrated in FIG. 3, the two bits in the erased state E may indicate "11," and the program states P1, P2, and P3 may respectively indicate "10," "00," and "01." Mapping of states and bit values is not limited to the illustration of FIG. 3.

As mentioned above, the nonvolatile memory cell 101 may be programmed by using ISPP. Programming the nonvolatile memory cell 101 may be understood as changing a threshold voltage of the nonvolatile memory cell 101 in the erased state E to a value corresponding to a desired state. When the data to be stored in the nonvolatile memory cell 101 is "11," the nonvolatile memory cell 101 may not be programmed and remain in the erased state E.

According to ISPP, an operation of applying a voltage pulse (a programming operation) having a predetermined magnitude and width to the gate of the floating-gate transistor and an operation of verifying (a verifying operation) whether the changed threshold voltage is changed to a desired value may be repeatedly performed. When verification succeeds, the transition of the nonvolatile memory cell 101 to the desired state is determined to be successful, and accordingly, the nonvolatile memory cell 101 is excluded in a following programming process that is performed by applying the voltage pulse. When the verification fails, the transition of the nonvolatile memory cell 101 to the desired state is determined to have failed, and accordingly, the nonvolatile memory cell 101 may be additionally programmed by applying the voltage pulse.

FIG. 3 is an example of ISPP and illustrates a full sequence programming operation. As illustrated in FIG. 3, a first voltage V_1, a second voltage V_2, or a third voltage V_3 for determining threshold voltages corresponding to each state of the nonvolatile memory cell 101 may be used in the verifying operation of the nonvolatile memory cell 101. Referring to the lower graph of FIG. 3, a programming section A and a verification section B is repeated during ISPP. Due to a voltage pulse (a programming pulse) applied during the programming section A, the threshold voltage of the nonvolatile memory cell 101 may move from a value corresponding to the erased state E to values corresponding to each of the states P1, P2, and P3. During the verification section B, the first, second, and third voltages V_1, V_2, and V_3 may be sequentially applied, and whether the threshold voltage of the nonvolatile memory cell 101 moves to a value corresponding to a desired state due to the voltage pulse applied during the programming section A may be determined.

As described above, writing data in the nonvolatile memory cell 101 may be performed units of the page cell group 110 connected to the same word line among the nonvolatile memory cells 101 included in the cell array 100. That is, as illustrated in FIG. 3, the voltage pulse applied during the programming section A and the verification section B may be identically applied to the nonvolatile memory cells 101 included in the page cell group 110. According to data to write in the page cell group 110, bits to store in each of the nonvolatile memory cells 101 included in the page cell group 110 may be different from each other. Thus, while performing ISPP, according to the bits to be stored, a certain nonvolatile memory cell 101 may be prevented from being programmed by the voltage pulse applied during the programming section A. For example, when first and second nonvolatile memory cells included in the page cell group 110 are to be programmed to the erased state E and the state P1 respectively in correspondence to data to be written, the first nonvolatile memory cell may be controlled so that it is not programmed in ISPP. Also, the second nonvolatile memory cell may be controlled so that it is not programmed during the programming section A after the threshold voltage moves to a value corresponding to state P1 due to ISPP.

A voltage applied to the bit line BL connected to the nonvolatile memory cell 101 may be controlled to control whether each of the nonvolatile memory cells 101 included in the page cell group 110 is programmed. Since the floating-gate transistor may inject an electron to the floating gate according to the voltage difference between a gate and a source or a drain, programming of the nonvolatile memory cell 101 may be controlled by controlling the voltage of the source or the drain. For example, a voltage of 0V or 1V may be applied through the bit line BL to the nonvolatile memory cell 101 that requires programming due to the voltage pulse applied during the program section A. Meanwhile, a power voltage VDD may be applied through the bit line BL to the nonvolatile memory cell 101 that is to be program-inhibited due to the voltage pulse applied during the programming section A.

Figure 4:
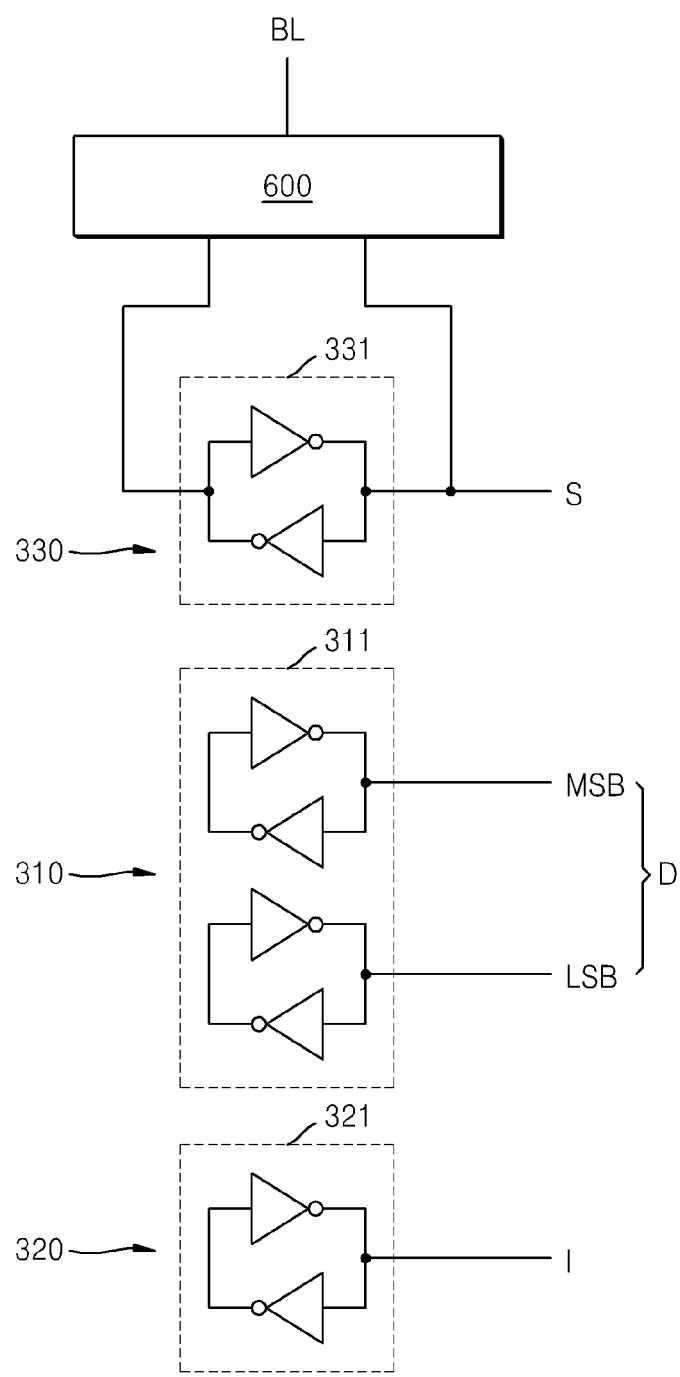
FIG. 4 is a logic diagram illustrating latches corresponding to a bit line, according to an exemplary embodiment of the inventive concept.

FIG. 4 is a logic diagram illustrating latches corresponding to a bit line, according to an exemplary embodiment of the inventive concept. Referring again to FIG. 2, the nonvolatile memory device 10 includes the data latch set 310, the inhibit latch set 320, the sensing latch set 330, and the logic unit 340 connected to the sensing latch set 330. As illustrated in FIG. 4, the data latch set 310, the inhibit latch set 320, and the sensing latch set 330 may respectively include a data latch unit 311, an inhibit latch unit 321, and a sensing latch unit 331 corresponding to bit line BL.

The data latch unit 311 may store data D to be written in a nonvolatile memory cell 101 included in the page cell group 110. The number of latches included in the data latch unit 311 may be determined according the amount of data (i.e., the number of bits), stored in the nonvolatile memory cell 101. For example, according to the present exemplary embodiment, since the nonvolatile memory cell 101 is an MLC that may store two bits, the data latch unit 311 includes two latches, as illustrated in FIG. 4. The latches included in the data latch unit 311 store a most significant bit MSB and a least significant bit LSB, respectively.

The inhibit latch unit 321 may store data I indicating whether the nonvolatile memory cell 101 included in the page cell group 110 is program-inhibited. As described with reference to FIG. 3, when the nonvolatile memory cell 101 remains in the erased state E or the transition to any of the states P1, P2, and P3 is completed, the nonvolatile memory cell 101 may be program-inhibited by the voltage pulse during the following program section A. Accordingly, the inhibit latch unit 321 stores the data I as to whether the nonvolatile memory cell 101 is program-inhibited, and thus the control unit 200 is able to determine whether the nonvolatile memory cell 101 is programmed by referring to the data I. Accordingly, the control unit 200 controls voltage applied to the bit line BL connected to the nonvolatile memory cell 101. The value of the data I stored in the inhibit latch unit 321 may be determined according to data stored in the data latch unit 311 or according to a verification result of the nonvolatile memory cell 101, as further described below.

In a process of programming and verifying the nonvolatile memory cell 101, according to the present exemplary embodiment, by changing the data I stored in the inhibit latch unit 321 according to a verification result of the nonvolatile memory cell 101, the data D stored in the data latch unit 311 is retained until writing of the data D in the nonvolatile memory cell 101 is completed. That is, by not changing the data D stored in the data latch unit 311 to a specific value (for example, "11" corresponding to the erased state E) according to the verification result of the nonvolatile memory cell 101, the data D stored in the data latch unit 311 is retained. The data D retained in the data latch unit 311 may be written in a nonvolatile memory cell included in a page cell group different from the page cell group 110 included in the nonvolatile memory cell 101 in which the data D is already written.

The sensing latch unit 331 may be used to control the voltage applied to the bit line BL or to detect the voltage of the bit line BL. For example, the sensing latch unit 331 is connected to the logic unit 340, and the control unit 200 may control the logic unit 340 to change a value of data S stored in the sensing latch unit 331. The logic unit 340 may apply a voltage to the bit line BL according to the data S stored in the sensing latch unit 331. Accordingly, when the nonvolatile memory cell 101 connected to the bit line BL is programmed or program-inhibited, the control unit 200 may change the data S stored in the sensing latch unit 331.

Also, the value of the data S of the sensing latch unit 331 may be changed according to the voltage of the bit line BL, and the control unit 200 may recognize a state (voltage) of the bit line BL by detecting the data S of the sensing latch unit 331 via the logic unit 340. Accordingly, when the nonvolatile memory cell 101 is verified or the data stored in the nonvolatile memory cell 101 is read, the control unit 200 detects the data S stored in the sensing latch unit 331.

Figure 5:
FIG. 5 is a view illustrating states of a data latch unit and an inhibit latch unit before and after a data writing operation, according to an exemplary embodiment of the inventive concept.

FIG. 5 is a view illustrating a state of the data latch unit 311 and the inhibit latch unit 321 before and after a data writing operation, according to an exemplary embodiment of the inventive concept. Referring to FIGS. 3 through 5, the nonvolatile memory cell 101 is capable of transition to any of the four states E, P1, P2, and P3, according to data to be written. FIG. 5 illustrates a change of the data D stored in the data latch unit 311 and the data I stored in the inhibit latch unit 321, according to the data to write and a final state of the nonvolatile memory cell 101 according to the data to be written.

Upon starting the writing of data, the data latch unit 311 stores the data D to write, and the data D may correspond to a state of the nonvolatile memory cell 101. Also, the data I stored in the inhibit latch unit 321 may be determined according to the data D stored in the data latch unit 311. For example, as illustrated in FIG. 5, the data I stored in the inhibit latch unit 321 may have a value "1" when the data D stored in the data latch unit 311 is "11," while the data I stored in the inhibit latch unit 321 may have a value "0" for the other values of the data D. That is, when the value of the data D stored in the data latch unit 311 is "11," and accordingly the final state of the nonvolatile memory cell 101 is the erased state E, the nonvolatile memory cell 101 is program-inhibited. Thus, the inhibit latch unit 321 indicates that the nonvolatile memory cell 101 remains in the erased state E by storing the data I having the value "1."

Meanwhile, when the final state of the nonvolatile memory cell 101 is any of the states P1, P2, and P3 other than the erased state E, the inhibit latch unit 321 stores the data I having the value "0." Accordingly, the nonvolatile memory cell 101 may be programmed until the transition of the nonvolatile memory cell 101 to the final state due to the voltage pulse applied during the programming section A is completed. Referring to FIG. 3, the data I stored in the inhibit latch unit 321 may be changed by going through the verification section B. For example, when a threshold value of the nonvolatile memory cell 101 is determined to have moved to a value corresponding to the final state during the verification section B, the data I stored in the inhibit latch unit 321 is changed to the value "1."

As illustrated in FIG. 5, upon completing the writing of the data, the data I stored in the inhibit latch unit 321 has the value "1" regardless of the final state. That is, as the nonvolatile memory cell 101 goes through the repeated programming sections A and verification sections B, the data I stored in the inhibit latch unit 321 corresponding to the nonvolatile memory cell 101 is changed to the value "1." Also, as illustrated in FIG. 5, the data D stored in the data latch unit 311 may retain the same value upon completing the operation of writing as upon starting the operation of writing. That is, the data D stored in the data latch unit 311 may be retained until the writing operation is completed by storing information according to the verification result of the nonvolatile memory cell 101 in an extra storage unit (for example, the inhibit latch unit 321).

As described above, the same data may be stored in different regions of the nonvolatile memory device 10. In this case, when data corresponding to a previous writing operation is retained in the data latch unit 311, re-loading of the same data in the data latch unit 311 in a sequential writing operation becomes unnecessary. Also, the nonvolatile memory device 10 may not need a component (for example, a master latch unit) for temporarily storing data to be stored in the nonvolatile memory cell 101.

Figure 6:
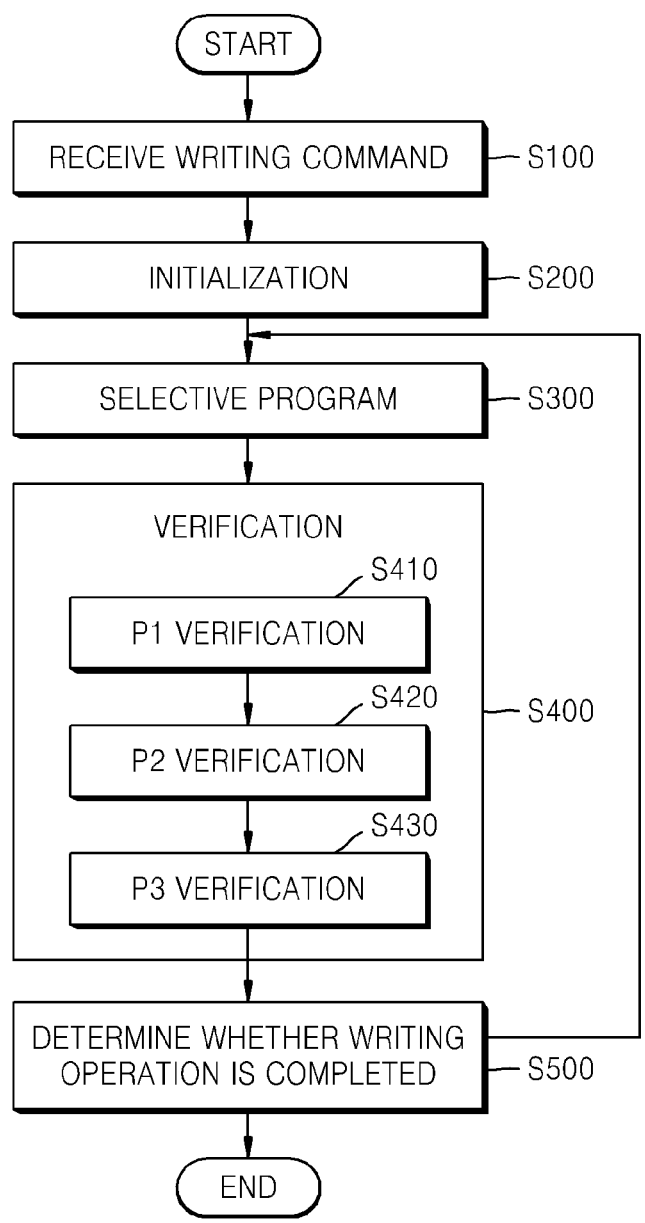
FIG. 6 is a flowchart schematically illustrating a method of writing data in a nonvolatile memory device, according to an exemplary embodiment of the inventive concept.

FIGS. 6 through 11 are flowcharts illustrating a method of writing data in a nonvolatile memory device, according to an exemplary embodiment of the inventive concept. In detail, FIG. 6 is a flowchart schematically illustrating the method of writing data from start to end, and FIGS. 7 through 11 are flowcharts illustrating in detail each operation of FIG. 6.

FIG. 6 is the flowchart schematically illustrating the method of writing data to the nonvolatile memory device, according to an exemplary embodiment. Referring to FIGS. 2 through 4, the nonvolatile memory device 10 receives an external writing command CMD in operation S100. The command CMD may include a first command CMD_1 or a second command CMD_2. The nonvolatile memory device 10 also receives an address ADDR or data DATA together with the command CMD. The address ADDR designates the nonvolatile memory cell 101 to which the data DATA is written, and the data DATA is selectively received according to the type of the command CMD.

The nonvolatile memory device 10 performs an initialization operation S200. That is, the nonvolatile memory device 10 sets a value of data I stored in the inhibit latch unit 321 according to data D to write in the nonvolatile memory cell 101. The nonvolatile memory device 10 selectively programs the nonvolatile memory cell 101 according to the data I stored in the inhibit latch unit 321 in operation S300. For example, the nonvolatile memory cell 101 may not be programmed when the data I stored in the inhibit latch unit 321 is "1," and may be programmed when the data I stored in the inhibit latch unit 321 is "0."

After selectively programming the nonvolatile memory cell 101 according to the data I stored in the inhibit latch unit 321, the nonvolatile memory device 10 verifies the nonvolatile memory cell 101 in operation S400. The nonvolatile memory device 10 may determine the transition of a current state of the nonvolatile memory cell 101 to a final state corresponding to data to be written by using the data D stored in the data latch unit 311. For example, since the nonvolatile memory cell 101 according to the present exemplary embodiment is an MLC that may store two bits, the nonvolatile memory device 10 may sequentially determine whether the transitions of the nonvolatile memory cell 101 to the states P1, P2, and P3 are completed in verification operations S410, S420, and S430, respectively. The data I stored in the inhibit latch unit 321 may be changed according to the verification result. As described above, since writing data is performed in the page units of the page cell group 110, the voltages V_1, V_2, and V_3 according to the verifications corresponding to the states P1, P2, and P3 may be applied to a gate of the nonvolatile memory cells 101 included in the page cell group 110.

The nonvolatile memory device 10 determines whether the writing operation according to the received writing command is completed in operation S500. When the page cell group 110 including the nonvolatile memory cell 101 that goes through an antecedent program stage and a verification stage satisfies a predetermined condition, the nonvolatile memory device 10 ends the writing operation. When the page cell group 110 does not satisfy the predetermined condition, the nonvolatile memory cell 101 is again selectively programmed in operation S300. Regardless of the determination result of the nonvolatile memory device 10 as to whether the writing operation is completed, the data latch unit 311 retains the data D to write the DATA D in the nonvolatile memory cell 101, and only the value of the data I stored in the inhibit latch unit 321 is changed by going through each of the operations.

Figure 7:
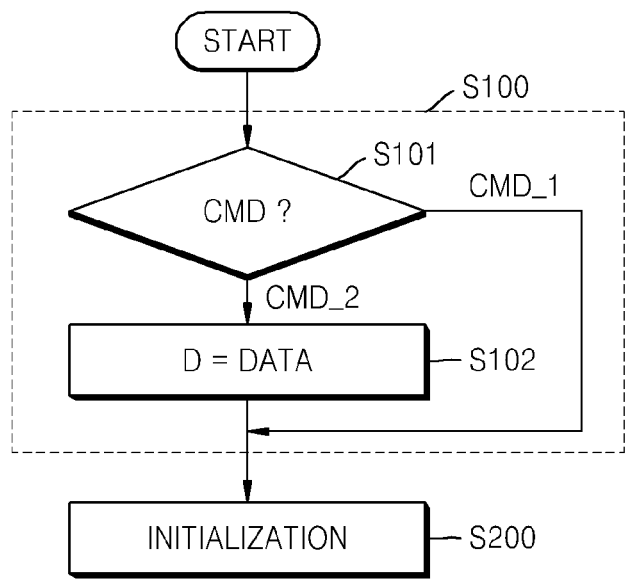
FIG. 7 is a flowchart illustrating in detail an operation for receiving a writing command of FIG. 6, according to an exemplary embodiment of the inventive concept.

FIG. 7 is a flowchart illustrating in detail receiving the writing command in operation S100 of FIG. 6, according to an exemplary embodiment of the inventive concept. The nonvolatile memory device 10 determines whether the received command CMD is the first writing command CMD_1 or the second writing command CMD_2 in operation S101. The first writing command CMD_1 is a request to write the data D stored in the data latch unit 311 in the nonvolatile memory cell 101. For example, the first writing command CMD_1 includes a command word of copy-back. The second writing command CMD_2 is a request to write data DATA that the nonvolatile memory device 10 receives together with the second writing command CMD_2 in the nonvolatile memory cell 101.

When it is determined in operation S101 that the received command CMD is the first writing command CMD_1, the nonvolatile memory device 10 ends receiving the writing command in operation S100 and proceeds to the initialization stage operation S200. That is, the nonvolatile memory device 10 does not change the data D stored in the data latch unit 311. However, when it is determined in operation S101 that the received command CMD is the second writing command CMD_2, the nonvolatile memory device 10 stores the data DATA received together with the second writing command CMD_2 in the data latch unit 311 in operation S102. That is, the nonvolatile memory device 10 may change the data D stored in the data latch unit 311 to the data DATA (D=DATA) received together with the second writing command CMD_2.

Figure 8:
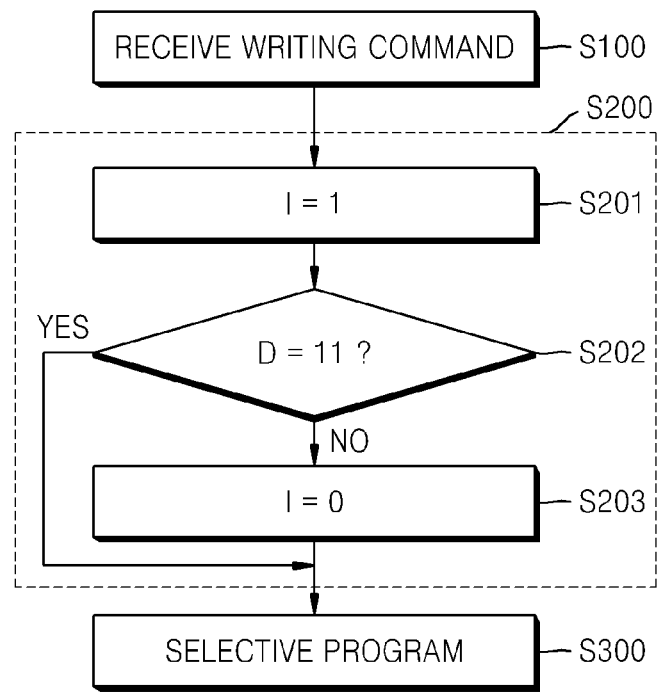
FIG. 8 is a flowchart illustrating in detail a initialization operation of FIG. 6, according to an exemplary embodiment of the inventive concept.

FIG. 8 is a flowchart illustrating in detail the initialization operation S200 of FIG. 6, according to an exemplary embodiment of the inventive concept. The nonvolatile memory device 10 sets the data I stored in the inhibit latch unit 321 according to the data to write in the nonvolatile memory cell 101. As illustrated in FIG. 8, the nonvolatile memory device 10 may set the data I stored in the inhibit latch unit 321 to have the value "1" in operation S201. Then, in operation S202, the nonvolatile memory device 10 determines whether the data D stored in the data latch unit 311 is "11," which is the value corresponding to the erased state E of the nonvolatile memory cell 101. When it is determined that the data D stored in the data latch unit 311 is "11," the nonvolatile memory device 10 proceeds to the selective program operation S300. When it is determined that the data D stored in the data latch unit 311 is not "11," the nonvolatile memory device 10 sets the data I stored in the inhibit latch unit 321 to the value "0" (I=0) in operation S203.

Consequently, when the initialization operation S200 ends, data I having the value "0" indicates that the nonvolatile memory cell 101 needs to be programmed for the transition to any of the states P1, P2, and P3 other than the erased state E. However, when the operation S200 ends, data I having the value "1" indicates that the nonvolatile memory cell 101 is program-inhibited to remain in the erased state E.

Figure 9:
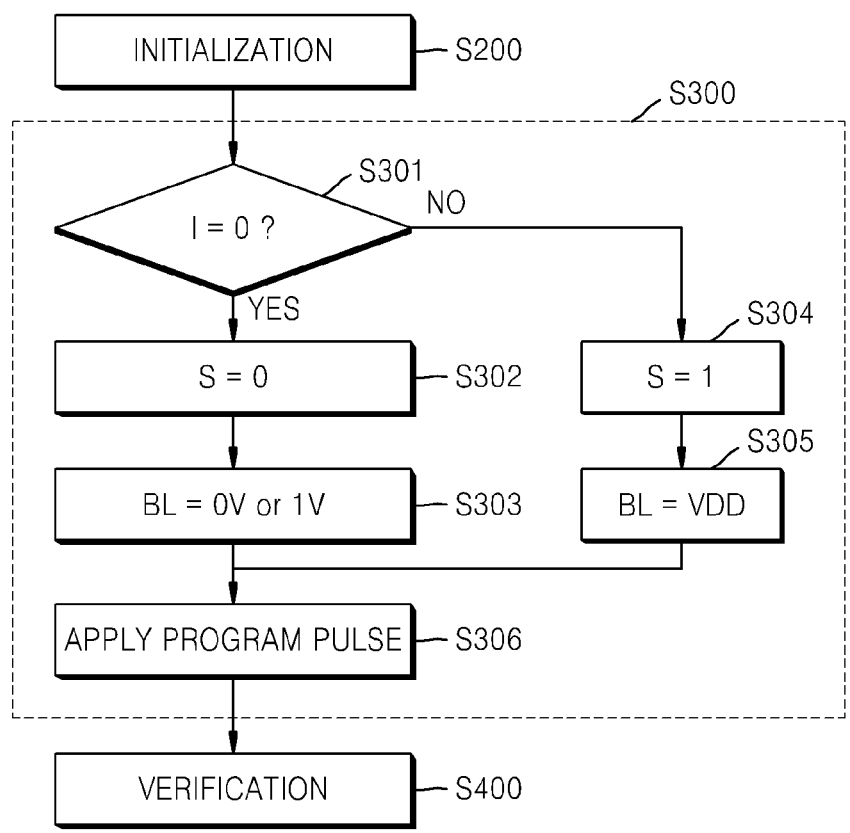
FIG. 9 is a view illustrating a selective program operation of FIG. 6, according to an exemplary embodiment of the inventive concept.

FIG. 9 is a view illustrating the selective program operation S300 of FIG. 6, according to an exemplary embodiment of the inventive concept. Following the initialization operation S200, the nonvolatile memory device 10 determine whether the nonvolatile memory cell 101 is programmed based on the value of data I stored in the inhibit latch unit 321, in operation S301. When it is determined that the value of data I stored in the inhibit latch unit 321 is "0," the nonvolatile memory cell 101 needs to be programmed, and thus the nonvolatile memory device 10 sets the data S stored in the sensing latch unit 331 to have the value "0" in operation S302 (S=0). The logic unit 340 of the nonvolatile memory device 10 may apply 0V or 1V to the bit line BL according to the value "0" of the data S stored in the sensing latch unit 331 in operation S303.

When it is determined that the value of the data I stored in the inhibit latch unit 321 is "1," the nonvolatile memory cell 101 may be program-inhibited, and thus the nonvolatile memory device 10 sets the data S stored in the sensing latch unit 331 to "1," in operation S304 (S=1). The logic unit 340 of the nonvolatile memory device 10 applies a power voltage VDD to the bit line BL according to the value "1" of the data S stored in the sensing latch unit 331 in operation S305.

When the voltage determined according to the value of the data I stored in the inhibit latch unit 321 is applied to the bit line BL, a program pulse is applied to the nonvolatile memory cell 101 (that is, the gate of the floating-gate transistor) in operation S306. When the voltage applied to the bit line BL is 0V or 1V, the nonvolatile memory cell 101 is programmed by the program pulse, and when the voltage applied to the bit line is not 0V or 1V (e.g., when BL=VDD) the nonvolatile memory cell 101 is program-inhibited by the program pulse. Next, the nonvolatile memory device 10 moves to the verification operation S400 for verifying the nonvolatile memory cell 101.

Figure 10:
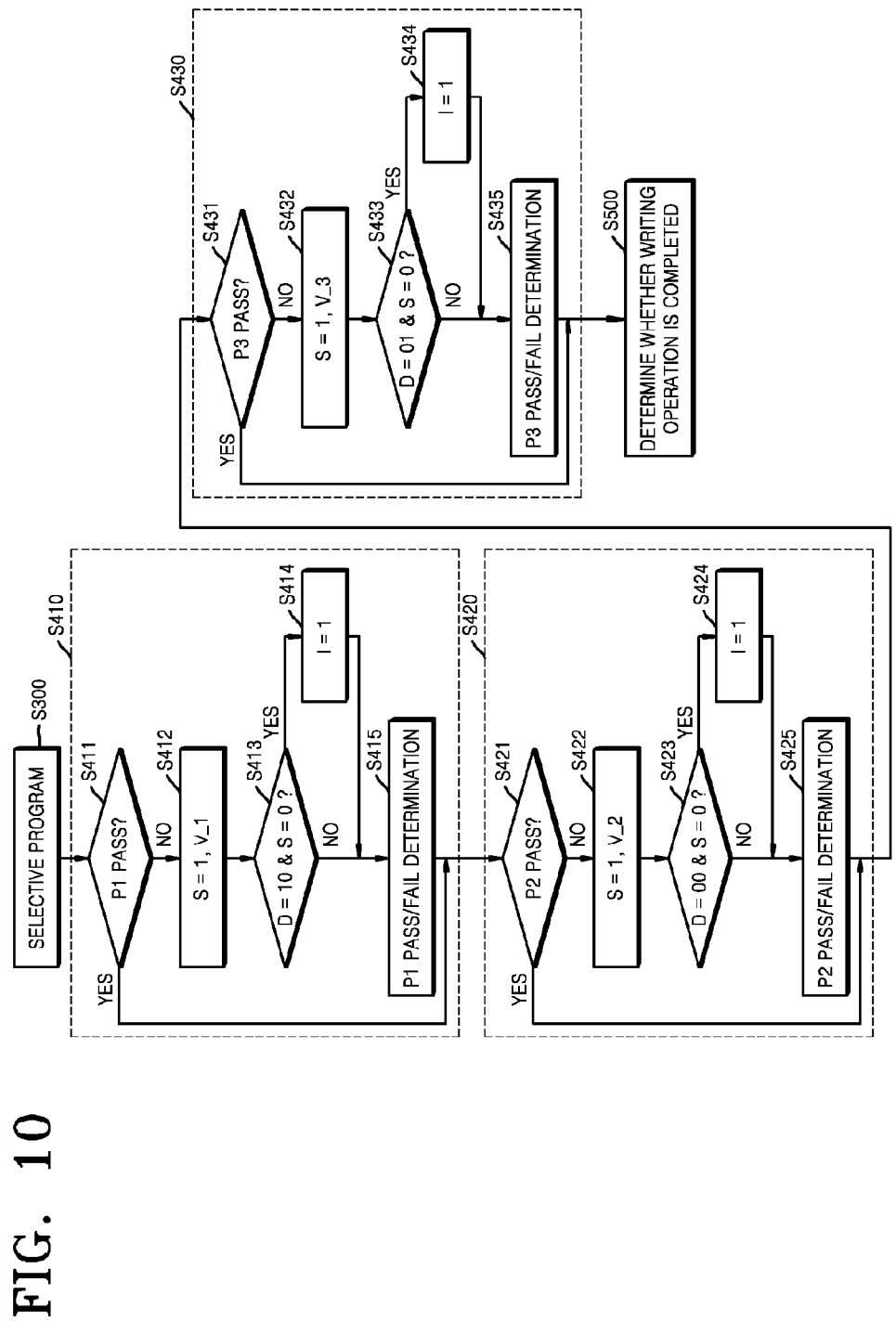
FIG. 10 is a flowchart illustrating in detail a verification operation of FIG. 6, according to an exemplary embodiment of the inventive concept.

FIG. 10 is a flowchart illustrating in detail the verification in operation S400 of FIG. 6, according to an exemplary embodiment of the inventive concept. Referring to FIGS. 6 and 10, the verification stage of the nonvolatile memory cell 101 includes a P1 verification operation S410, a P2 verification operation S420, and a P3 verification operation S430. In each of the verification operations S410, S420, and S430, the nonvolatile memory cell 101 may be verified based on the data D stored in the data latch unit 311. The data I stored in the inhibit latch unit 321 may be set (or changed) according to the verification result.

Regarding the P1 verification operation S410, the nonvolatile memory device 10 determines whether the nonvolatile memory cell 101 goes through the P1 verification operation S410. For example, the nonvolatile memory device 10 determines whether the nonvolatile memory cell 101 goes through the P1 verification operation S410 based on the value of data I stored in the inhibit latch units 321 of the nonvolatile memory cells 101 included in the page cell group 110 or by data additionally stored according to a determination result of an earlier performed P1 pass/fail determination in operation S415.

When the P1 verification operation S410 was successful, the nonvolatile memory device 10 moves to the P2 verification operation S420. When the P1 verification operation S410 was not successful, the nonvolatile memory device 10 sets the data S stored in the sensing latch unit 331 to "1" and applies the first voltage V_1 to the gate of the floating-gate transistor via the world line WL in order to verify whether the nonvolatile memory cell 10 has a threshold voltage corresponding to the P1 state, in operation S412. When the data S stored in the sensing latch unit 331 is set to the value "1," the logic unit 340 applies a constant voltage to the bit line BL.

Next, the nonvolatile memory device 10 determines in operation S413 whether the data D stored in the data latch unit 311 has a value "10" corresponding to the P1 state and whether the data S stored in the sensing latch unit 331 is changed to "0". For example, when the nonvolatile memory cell 101 is programmed to correspond to the P1, P2, or P3 state, the threshold voltage of the floating-gate transistor may be greater than the first voltage V_1. Thus, the floating-gate transistor may be turned off. Meanwhile, when the nonvolatile memory cell 101 is in the erased state E, the floating-gate transistor may be turned on because the threshold voltage of the floating-gate transistor is less than the first voltage V_1. The nonvolatile memory cell 101 including the turned-off floating-gate transistor is referred to as an "off cell," and the nonvolatile memory cell 101 including the turned-on floating-gate transistor is referred to as an "on cell."

For example, when the nonvolatile memory cell 101 is an off cell, since the bit line BL is blocked from a ground voltage 0V due to the floating-gate transistor included in the off cell, the voltage of the bit line BL may be retained. The voltage of the bit line BL may be applied to the gate of the transistor included in the logic unit 340, and accordingly, the transistor included in the logic unit 340 may be turned on. The sensing latch unit 311 connected to the transistor may change the value of the stored data D to "0." Thus, when the data S stored in the sensing latch unit 311 is changed to "0," the nonvolatile memory cell 101 may be determined to be the off cell.

When the value of the data D stored in the data latch unit 311 is "10," and the data S stored in the sensing latch unit 331 is changed to "0," the nonvolatile memory device 10 sets the data I stored in the inhibit latch unit 321 to "1" in operation S414 (I=1). Meanwhile, when the value of the data D stored in the data latch unit 311 is not "10" and/or the data S stored in the sensing latch unit 331 is retained as "1," the nonvolatile memory device 10 proceeds to operation S415 in which it is determined whether the P1 state passed or failed without changing the data I stored in the inhibit latch unit 321.

The nonvolatile memory device 10 may determine whether the P1 state passed or failed in operation S415 by determining whether the nonvolatile memory cell 101, in which the data having the value "10" is to be written among the nonvolatile memory cells 101 included in the page cell group 110, is in the P1 state. For example, the nonvolatile memory device 10 may apply a constant voltage to a common node connected to the bit lines BL connected to the nonvolatile memory cell 101 in which the data having the value "10" is to be written. Also, the nonvolatile memory device 10 may apply the first voltage V_1 to the word line WL. When the threshold voltage does not reach the first voltage V_1, and thus, the nonvolatile memory cell 101 is an on-cell, the voltage of the common node may be changed, for example, to ground voltage 0V. Thus, the nonvolatile memory device 10 may determine whether the P1 state passed or failed by detecting the voltage of the common node. Then, the nonvolatile memory device 10 may sequentially perform the P2 verification operation S420 and the P3 verification operation S430.

The operations included in each of the P2 verification operation S420 and the P3 verification operation S430 are similar to the operation included in the P1 verification operation S410, and thus detailed descriptions thereof will not be repeated. However, in the P2 verification operation S420, the nonvolatile memory device 10 may apply the second voltage V_2 to the word line WL in operation S422, and may determine whether the value of the data D stored in the data latch unit 311 is "00" corresponding to the P2 state in operation S423. Also, in the P3 verification operation S430, the nonvolatile memory device 10 may apply the third voltage V_3 to the word line WL in operation S432, and may determine the value of the data D stored in the data latch unit 311 is "01" corresponding to the P3 state in operation S433. The nonvolatile memory device 10 may end the P3 verification operation S430 and proceed to operation S500 for determining whether the writing operation is completed.

Figure 11:
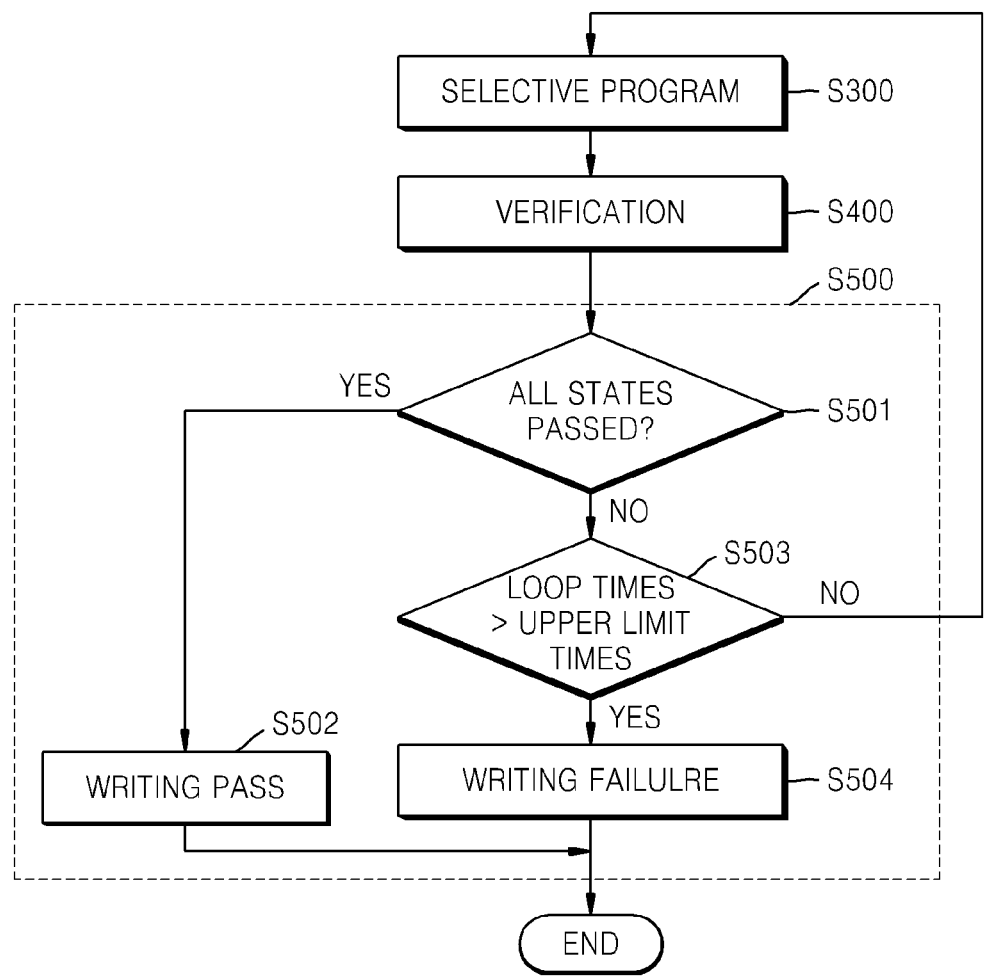
FIG. 11 is a flowchart illustrating in detail an operation for determining an end of the writing operation of FIG. 6, according to an exemplary embodiment of the inventive concept.

FIG. 11 is a flowchart illustrating in detail operation S500 of FIG. 6, determining whether the writing operation is completed, according to an exemplary embodiment of the inventive concept. The nonvolatile memory device 10 proceeds to operation S500 of determining whether the writing operation is completed, following the verification operation S400. The nonvolatile memory device 10 determines whether all states (e.g., states E, P1, P2, and P3 in the present example) are passed with respect to the nonvolatile memory cells 101 included in the page cell group 110 in operation S501. When all of the states are passed, the nonvolatile memory device 10 determines that the data writing operation is passed in operation S502, and the writing operation ends. However, when not all of the states are passed, the nonvolatile memory device 10 determines in operation S503 whether the number of times (loop times) that the nonvolatile memory device 10 performs the selective program operation S300 and the verification operation S400 is greater than a predetermined upper limit According to the determination result, the nonvolatile memory device 10 returns the process to the selective program operation S300 when the loop times are not greater than the predetermined upper limit, and determines that the data writing operation has failed in operation S504 when the loop times are greater than the predetermined upper limit, ending the writing operation.

Figure 12:
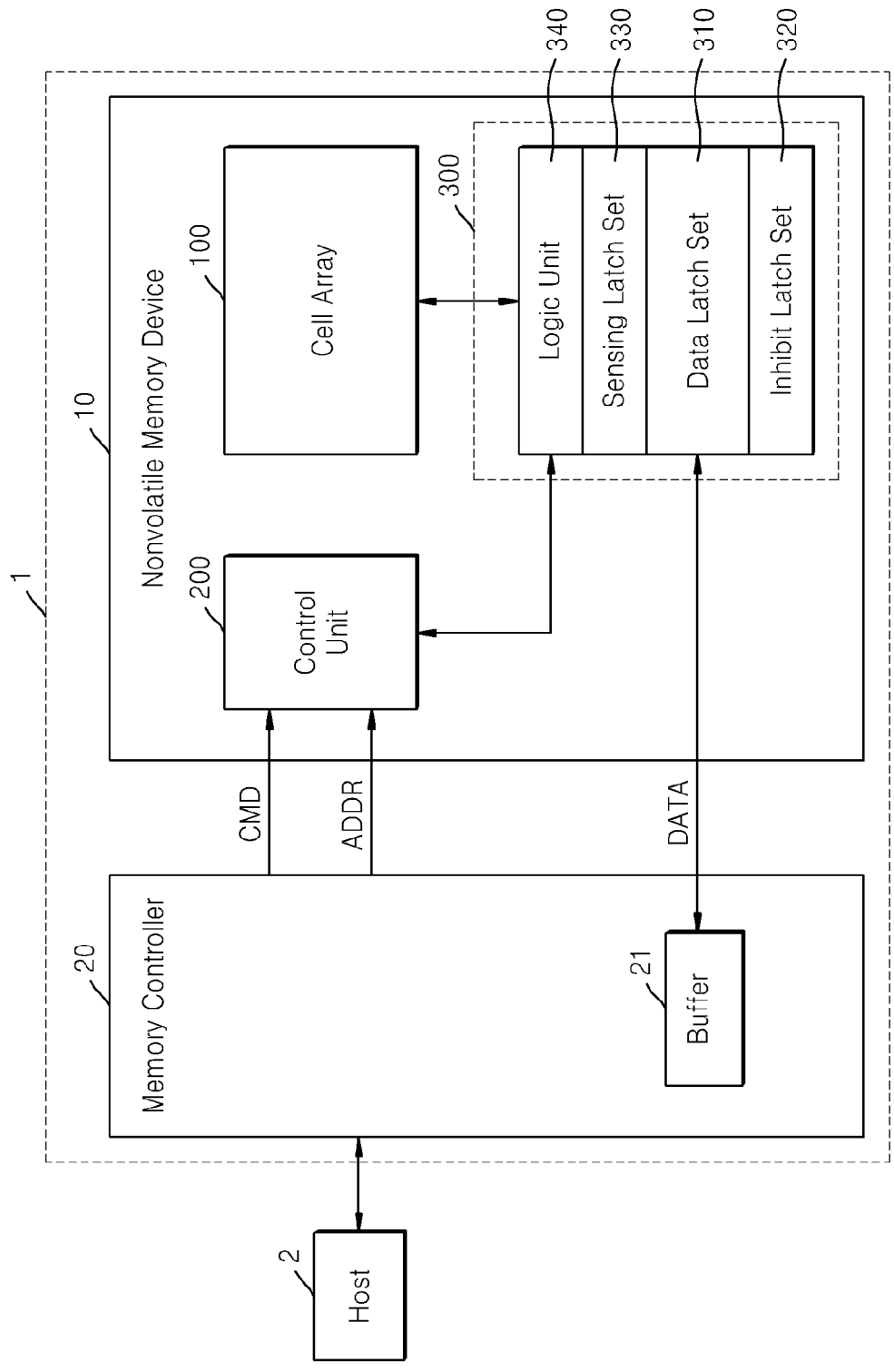
FIG. 12 is a block diagram illustrating a structure of a nonvolatile memory system, according to an exemplary embodiment of the inventive concept.

FIG. 12 is a block diagram of a nonvolatile memory system, according to an exemplary embodiment of the inventive concept. The nonvolatile memory system 1 may communicate with a host 2 via a predetermined protocol. For example, the nonvolatile memory system 1 may be a memory card, a Universal Serial Bus (USB) memory stick, or a solid state drive (SSD). The nonvolatile memory system 1 may perform an operation in response to a request received from the host 2. For example, the host 2 may request data storage, and the nonvolatile memory system 1 may store the data.

As illustrated in FIG. 12, the nonvolatile memory system 1 includes the nonvolatile memory device 10 and a memory controller 20. The memory controller 20 may transmit the command CMD and the address ADDR to the nonvolatile memory device 10, and may receive and transmit the data DATA. The nonvolatile memory device 10 is similar to that illustrated in FIG. 2, and thus, description of the nonvolatile memory device 10 will not be repeated.

Referring to FIGS. 11 and 12, in the nonvolatile memory device 10, the data writing operation may fail, and the nonvolatile memory device 10 may determine whether the writing operation passed or failed. When the writing operation of the nonvolatile memory device 10 fails, the memory controller 20 may write data with respect to the page cell group 110 corresponding to an address other than the previously tried address. As described above, according to the exemplary embodiment, since the data latch unit 311 of the nonvolatile memory device 10 retains the data D stored in the data latch unit 311, the memory controller 20 may transmit the first command CMD_1 and the new address ADDR to the nonvolatile memory device 10. The control unit 200 of the nonvolatile memory device 10 may control the logic unit 340 so that data stored in the latch set 310 including the data latch unit 311 is written in the page cell group 110 corresponding to the received address ADDR.

As illustrated in FIG. 12, the memory controller 20 may include a buffer 21 that stores the data to be written in the nonvolatile memory device 10. The data stored in the buffer 21 may be user data received from the host 2 or meta-data generated by the memory controller 20, for example. Also, the buffer 21 may store data that is read from the nonvolatile memory device 10.

Figure 13:
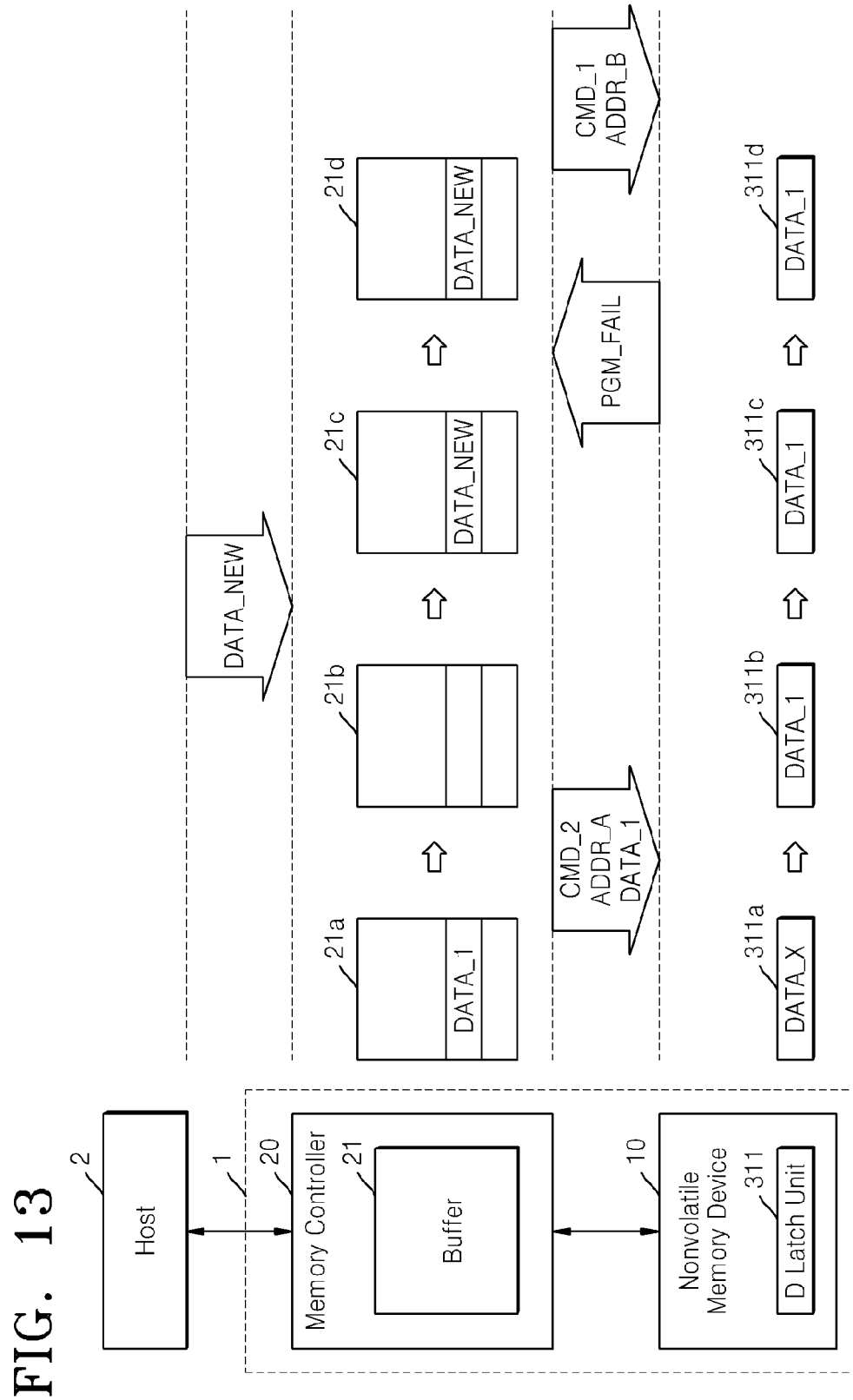
FIG. 13 is a functional block diagram illustrating a data writing operation of a nonvolatile memory system, according to an exemplary embodiment of the inventive concept.

FIG. 13 is a functional block diagram illustrating a data writing operation of the nonvolatile memory system 1, according to an exemplary embodiment of the inventive concept. As illustrated in FIG. 13, the memory system 1, which communicates with the host 2, includes the memory controller 20 and the nonvolatile memory device 10. The memory controller 20 includes the buffer 21, and the nonvolatile memory device 10 includes the data latch unit 311. For purposes of illustration, buffer 21 is represented over time as buffers 21a-21d, and data latch unit 311 is represented over time as data latch units 311a-311d.

As illustrated in FIG. 13, in an early stage, buffer 21a of the memory controller 20 stores data DATA_1 to be written in the nonvolatile memory device 10, while data latch unit 311a of the nonvolatile memory device 10 store data DATA_X corresponding to a previous writing operation. The memory controller 20 transmits a second writing command CMD_2, an address ADDR_A, and the data DATA_1 to the nonvolatile memory device 10 to write the data DATA_1, as discussed below. Next, the memory controller 20 sets a region of buffer 21b, in which the data DATA_1 had been stored, to an available state. Thus, as illustrated in FIG. 13, even while the nonvolatile memory device 10 performs the writing operation of the data DATA_1, data DATA_NEW received from the host 2 may be stored in the available region as shown in buffer 21c.

Meanwhile, the nonvolatile memory device 10 stores the data DATA_1 in data latch unit 311b according to the second writing command CMD_2, the address ADDR_A, and the data DATA_1 received from the memory controller 20. The nonvolatile memory device 10 performs the writing operation of the data DATA_1, and during the writing operation, the data DATA_1 is retained in data latch unit 311c. When the writing operation is completed, the data DATA_1 is retained in data latch unit 311d. If it is determined that the writing operation of the data DATA_1 fails, the memory controller 20 transmits a first writing command CMD_1 and an address ADDR_B to the nonvolatile memory device 10 to re-write the data DATA_1 retained in the data latch unit 311d.

Consequently, in preparation for a failure of the writing operation, the memory controller 20 does not need to retain the data DATA_1 in the buffer 21 transmitted together with the second writing command CMD_2 to the nonvolatile memory device 10, and may use the region of the buffer 21, in which the data DATA_1 is stored, for the new data DATA_NEW to be written. Thus, the memory controller 20 uses the buffer 21 more effectively and improves the response speed with respect to a writing request of the host 2.

Figure 14:
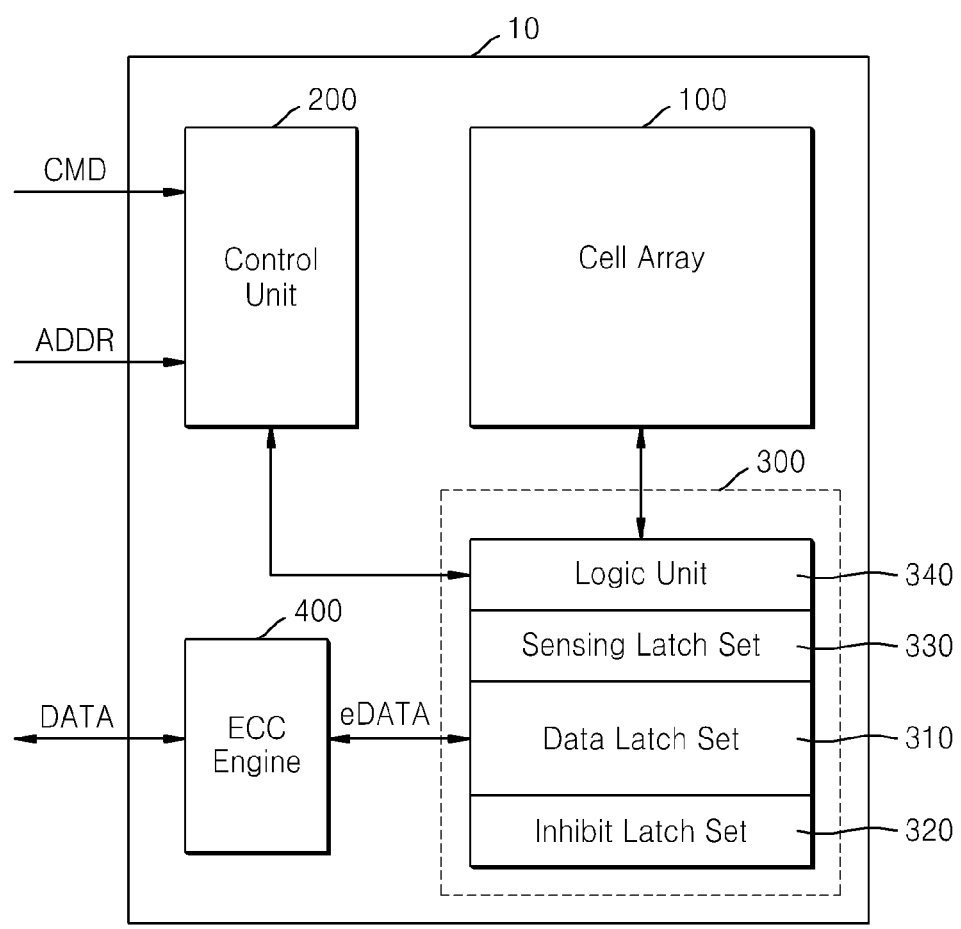
FIG. 14 is a block diagram illustrating a structure of a nonvolatile memory device, according to an exemplary embodiment of the inventive concept.

FIG. 14 is a block diagram illustrating a structure of the nonvolatile memory device 10, according to an exemplary embodiment of the inventive concept. Referring to FIG. 14, the nonvolatile memory device 10 further includes an error correction code (ECC) engine 400. When the nonvolatile memory device 10 performs a data writing or reading function according to an application, an error may occur due to various factors when data read from the cell array 100 is not consistent with the written data. Accordingly, the nonvolatile memory device 10 encodes data to be written in order to restore the data from the error, and writes the encoded data in the cell array 100. In addition, the nonvolatile memory device 10 reads the encoded data stored in the cell array 100, decodes the encoded data and outputs the decoded data to outside of the nonvolatile memory device 10.

The ECC engine 400 included in the nonvolatile memory device 10 is configured to encode and/or decode data. For example, the ECC engine 400 may encode the data DATA to write by including additional information and transmit the encoded data eDATA to the data latch set 310. Also, the ECC engine 400 may decode the encoded data eDATA received from the data latch set 310 and output the decoded data DATA to the outside of the nonvolatile memory device 10.

As described above, the data latch set 310 may retain the encoded data eDATA while the writing operation by ISPP is being performed. When the command received by the control unit 200 is the first writing command CMD_1, the encoded data eDATA retained in the data latch set 310 may be written in the cell array 100. Accordingly, the encoding operation by the ECC engine 400 may be omitted, and thus power consumption of the nonvolatile memory device 10 and a response time with respect to the writing operation may be reduced. Descriptions of the inhibit latch set 320, the sensing latch set 330, and the logic unit 340 are the same as described above with respect to FIG. 2, and therefore will not be repeated.

Figure 15:
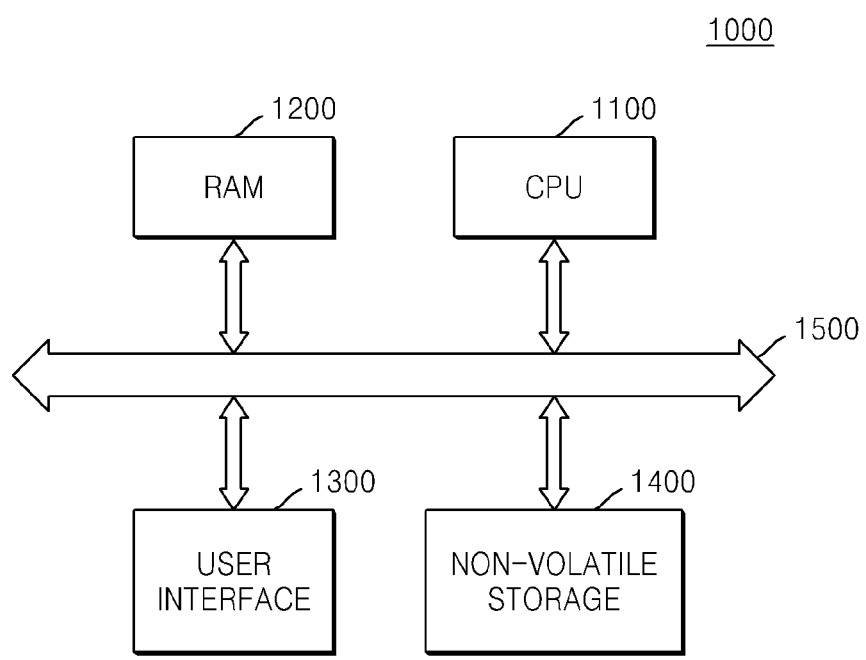
FIG. 15 is a block diagram illustrating a computing system including a nonvolatile memory system, according to an embodiment of the inventive concept.

FIG. 15 is a block diagram of a computing system 1000 including a nonvolatile memory system, according to an exemplary embodiment of the inventive concept. A nonvolatile memory system according to exemplary embodiments of the inventive concept may be mounted in the computing system 1000, such as a mobile device or a desk top computer, as a nonvolatile storage device 1400.

The computing system 1000 according to the exemplary embodiment may include a central processing unit (CPU) 1100, random access memory (RAM) 1200, a user interface 1300, and the nonvolatile storage device 1400. Each of the CPU 1100, the RAM 1200, the user interface 1300, and the nonvolatile storage device 1400 may be electrically connected to a bus 1500. A nonvolatile memory device included in the nonvolatile storage device 1400 may be, for example, NAND flash memory, NOR flash memory, magnetic random access memory (MRAM), resistance RAM (RRAM), ferroelectric RAM (FRAM), or phase change memory (PCM).

The nonvolatile storage device 1400 may include a memory controller and a nonvolatile memory device according to exemplary embodiments of the inventive concept. The nonvolatile memory device may retain data corresponding to a writing operation in a data latch unit (or a data latch set including the data latch unit) even when the data writing operation is completed. The memory controller may transmit a command to the nonvolatile memory device, and the nonvolatile memory device may write again the data stored in the data latch unit in response to the command.

Figure 16:
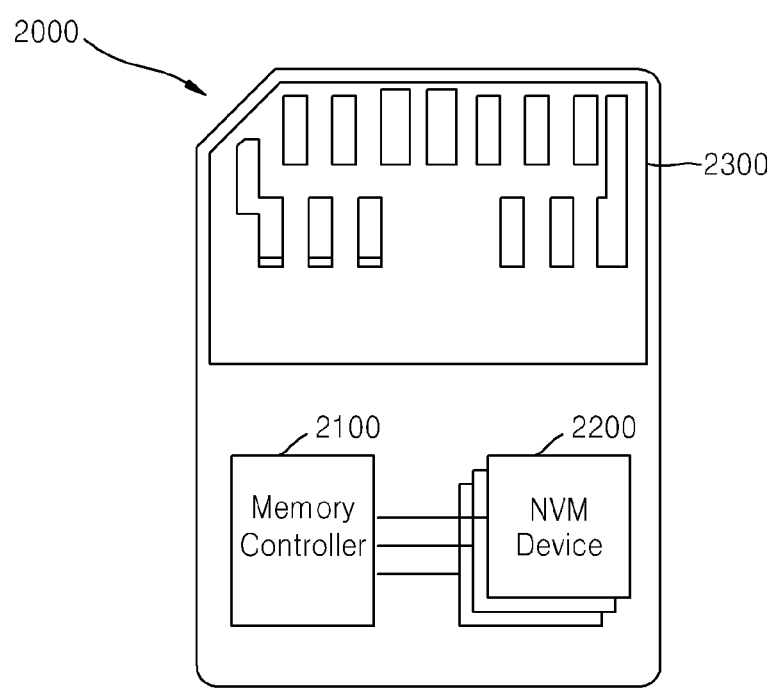
FIG. 16 is a view illustrating a memory card, according to an exemplary embodiment of the inventive concept.

FIG. 16 is a view illustrating a memory card 2000, according to an exemplary embodiment of the inventive concept. A nonvolatile memory system according to exemplary embodiments may be realized as a memory card. The memory card 2000 may be a portable storage device that may be connected to an electronic apparatus, such as a mobile device or a desk top computer, for example. As illustrated in FIG. 16, the memory card 2000 may include a memory controller 2100, a nonvolatile memory device 2200, and a port portion 2300. The memory card 2000 may be a multimedia card (MMC), an embedded multimedia card (eMMC), or a secure digital (SD) card, for example.

The memory controller 2100 may communicate with an external host via the port portion 2300, and may control the nonvolatile memory device 2200. As in the exemplary embodiments described above, the nonvolatile memory device 2200 may include a data unit, a data latch set, an inhibit latch set, a sensing latch set, and a logic unit. The nonvolatile memory device 2200 may retain data corresponding to a writing operation in the data latch set even when the data writing operation is completed. The memory controller may transmit a command to the nonvolatile memory device, and the nonvolatile memory device may write again the data stored in the data latch set in response to the command.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of writing data in a nonvolatile memory device comprising a first latch unit, a second latch, and a nonvolatile memory cell, the method comprising:
   receiving a first writing command or a second writing command from outside of the nonvolatile memory device; and
   writing first data stored in the first latch unit in the nonvolatile memory cell in response to the first or second writing command, wherein the writing of the first data in the nonvolatile memory comprises:
      selectively programming the nonvolatile memory cell according to second data stored in the second latch,
      verifying the nonvolatile memory cell based on the first data, and
      changing the second data according to a verification result, wherein
   the first data is retained in the first latch unit until the writing of the first data, stored in the first latch unit, in the nonvolatile memory cell is completed.

2. The method of claim 1, wherein the writing of the first data is repeated one or more times by incremental step pulse programming (ISPP).

3. The method of claim 1, further comprising setting the second data according to the first data in response to the first or second writing command prior to the writing of the first data stored in the first latch unit in the nonvolatile memory cell.

4. The method of claim 1, wherein the receiving of the first or second writing command comprises:
   retaining the first data stored in the first latch unit upon receiving the first writing command; and
   changing the first data stored in the first latch unit to data received, in response to the second writing command, from outside of the nonvolatile memory device, upon receiving the second writing command.

5. The method of claim 1, wherein the nonvolatile memory cell stores a plurality of bits, and the first latch unit comprises a plurality of latches equal in number to the plurality of bits.

6. The method of claim 1, wherein the nonvolatile memory device further comprises:
   a plurality of nonvolatile memory cells; and
   a plurality of first latch units each corresponding to a nonvolatile memory cell, connected to a word line, among the plurality of the nonvolatile memory cells.

7. The method of claim 1, further comprising:
   receiving data from outside of the nonvolatile memory device;
   encoding the received data according to an error correction code (ECC); and
   storing the encoded data in the first latch unit as the first data.

8. The method of claim 1, further comprising providing a state machine for controlling the writing of data in the nonvolatile memory device.

9. A method of writing data in a nonvolatile memory system comprising a nonvolatile memory device and a memory controller communicating with the nonvolatile memory device, the nonvolatile memory device comprising a first latch unit and a nonvolatile memory cell in a cell array, the method comprising:
   receiving a first writing command from the memory controller;
   retaining, within the first latch unit, first data that is stored within the first latch unit at the time the first writing command is received;
   writing the first data stored in the first latch unit in the nonvolatile memory cell, in response to the first writing command, wherein the first data is retained in the first latch unit until the writing of the first data in the nonvolatile memory cell is completed; and
   replacing the first data stored in the first latch unit with data received from a buffer region of the memory controller upon receiving a second writing command.

10. The method of claim 9, further comprising transmitting the first writing command to the nonvolatile memory device via the memory controller when the writing of the first data fails.

11. The method of claim 9, further comprising storing data to be written in the nonvolatile memory device in the buffer region of the memory controller;
   transmitting the second writing command and the data stored in the buffer region to the nonvolatile memory device via the memory controller; and
   setting the buffer region to an available state after transmitting the second writing command to the nonvolatile memory device.

12. The method of claim 9, wherein:
   the nonvolatile memory device further comprises a second latch unit that stores second data, and
   the writing of the first data comprises:
      selectively programming the nonvolatile memory cell according to the second data;
      verifying the nonvolatile memory cell based on the first data; and
      changing the second data according to a verification result.

13. The method of claim 9, wherein the nonvolatile memory system is a multimedia card (MMC), a secure digital (SD) card, or a solid state drive (SSD).

14. The method of claim 12, wherein the first latch unit comprises a data latch unit for storing the first data, and the second latch unit comprises an inhibit latch unit for storing the second data indicating whether the nonvolatile memory cell is program-inhibited.

15. A nonvolatile memory device comprising:
- a cell array comprising a plurality of nonvolatile memory cells in a page cell group corresponding to a word line, each nonvolatile memory cell being accessible by the word line and a bit line, and capable of transitioning between a plurality of states corresponding to respective data;
- a control unit configured to receive a first writing command and a second writing command; and
- a page buffer comprising:
  - a logic unit connected to the control unit and the cell array to enable control of the page buffer and the cell array by the control unit;
  - a data latch set comprising at least a first data latch storing first data for writing in a nonvolatile memory cell of the plurality of nonvolatile memory cells in response to the first or second writing command under control of the control unit; and
  - an inhibit latch set comprising an inhibit latch for storing data indicating whether a corresponding nonvolatile memory cell is in a program inhibited state, wherein the first data is retained in the first latch unit until writing the first data in the nonvolatile memory cell is completed.

16. The nonvolatile memory device of claim 15, wherein when data to be stored in a nonvolatile memory cell corresponds to an erased state, the corresponding inhibit latch indicates that the nonvolatile memory cell is program-inhibited.

17. The nonvolatile memory device of claim 15, wherein the page buffer further comprises a sensing latch set configured to store data to be written to or read form the cell array, such that the logic unit applies voltage to a bit line according to the data stored in the sensing latch or sets the data stored in the sensing latch set according to the voltage of the bit line.

18. The nonvolatile memory device of claim 15, further comprising an error correction code (ECC) engine configured to encode data received from outside of the non-volatile memory device and transmit the encoded data to the data latch set, and to decode encoded data received from the data latch set and output the decoded data to the outside of the nonvolatile memory device.

* * * * *